United States Patent
Chu et al.

(10) Patent No.: US 12,417,973 B2
(45) Date of Patent: Sep. 16, 2025

(54) SEMICONDUCTOR PACKAGING STRUCTURE AND METHOD FOR MANUFACTURING THE SAME

(71) Applicant: TAIWAN SEMICONDUCTOR MANUFACTURING COMPANY, LTD., Hsinchu (TW)

(72) Inventors: Chen-Te Chu, Hsinchu (TW); Yuan-Yang Hsiao, Hsinchu (TW); Chih-Pin Chiu, Hsinchu (TW); Ying-Yao Lai, Hsinchu (TW); Mao-Nan Wang, Hsinchu (TW); Chen-Chiu Huang, Hsinchu (TW); Dian-Hau Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 501 days.

(21) Appl. No.: 17/731,852

(22) Filed: Apr. 28, 2022

(65) Prior Publication Data

US 2023/0352394 A1   Nov. 2, 2023

(51) Int. Cl.
| | |
|---|---|
| H01L 23/522 | (2006.01) |
| H01L 21/02 | (2006.01) |
| H01L 23/528 | (2006.01) |
| H01L 23/532 | (2006.01) |

(52) U.S. Cl.
CPC .... *H01L 23/5223* (2013.01); *H01L 21/02164* (2013.01); *H01L 21/0217* (2013.01); *H01L 21/02274* (2013.01); *H01L 23/5226* (2013.01); *H01L 23/5283* (2013.01); *H01L 23/53295* (2013.01)

(58) Field of Classification Search
None
See application file for complete search history.

(56) References Cited

U.S. PATENT DOCUMENTS

| | | | |
|---|---|---|---|
| 6,204,182 B1 * | 3/2001 | Truninger | B41J 2/1629 438/723 |
| 2003/0096461 A1 * | 5/2003 | Hshieh | H01L 21/76838 257/E21.582 |
| 2004/0251555 A1 * | 12/2004 | Asai | H01L 23/522 257/E23.161 |
| 2006/0246641 A1 * | 11/2006 | Kammler | H10D 64/017 438/185 |
| 2007/0090455 A1 * | 4/2007 | Lim | H01L 21/84 438/303 |
| 2013/0193555 A1 * | 8/2013 | Tu | H10D 1/042 257/532 |
| 2020/0035596 A1 * | 1/2020 | Kao | H01L 24/05 |
| 2020/0035779 A1 * | 1/2020 | Huang | H01L 21/31116 |
| 2020/0105862 A1 * | 4/2020 | Wu | H01L 23/53295 |
| 2021/0098564 A1 * | 4/2021 | Yin | H01L 23/53295 |

* cited by examiner

*Primary Examiner* — Christine S. Kim
*Assistant Examiner* — Cole Leon Lindsey
(74) *Attorney, Agent, or Firm* — Birch, Stewart, Kolasch & Birch, LLP

(57) ABSTRACT

A semiconductor packaging structure includes a first passivation layer, a capacitor structure, and a second passivation layer. The capacitor structure is disposed on the first passivation layer. The second passivation layer is disposed on the capacitor structure opposite to the first passivation layer. The second passivation layer has a compressive stress that is smaller than −0.3 GPa.

20 Claims, 15 Drawing Sheets

SEMICONDUCTOR PACKAGING STRUCTURE AND METHOD FOR MANUFACTURING THE SAME

BACKGROUND

In the integrated circuit (IC) industry, a semiconductor packaging structure used for an IC device may have some structural failures after being subjected to thermal and stress tests, such as thermal cycling test (TCT), high temperature storage (HTS) test, and unbiased highly accelerated stress test (uHAST). These structural failures may include, for example, cracks in a layer, or layer delamination, which may cause poor production yields of the IC devices. Therefore, there is a need to improve the structural strength of the semiconductor packaging structure to prevent the aforesaid failures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
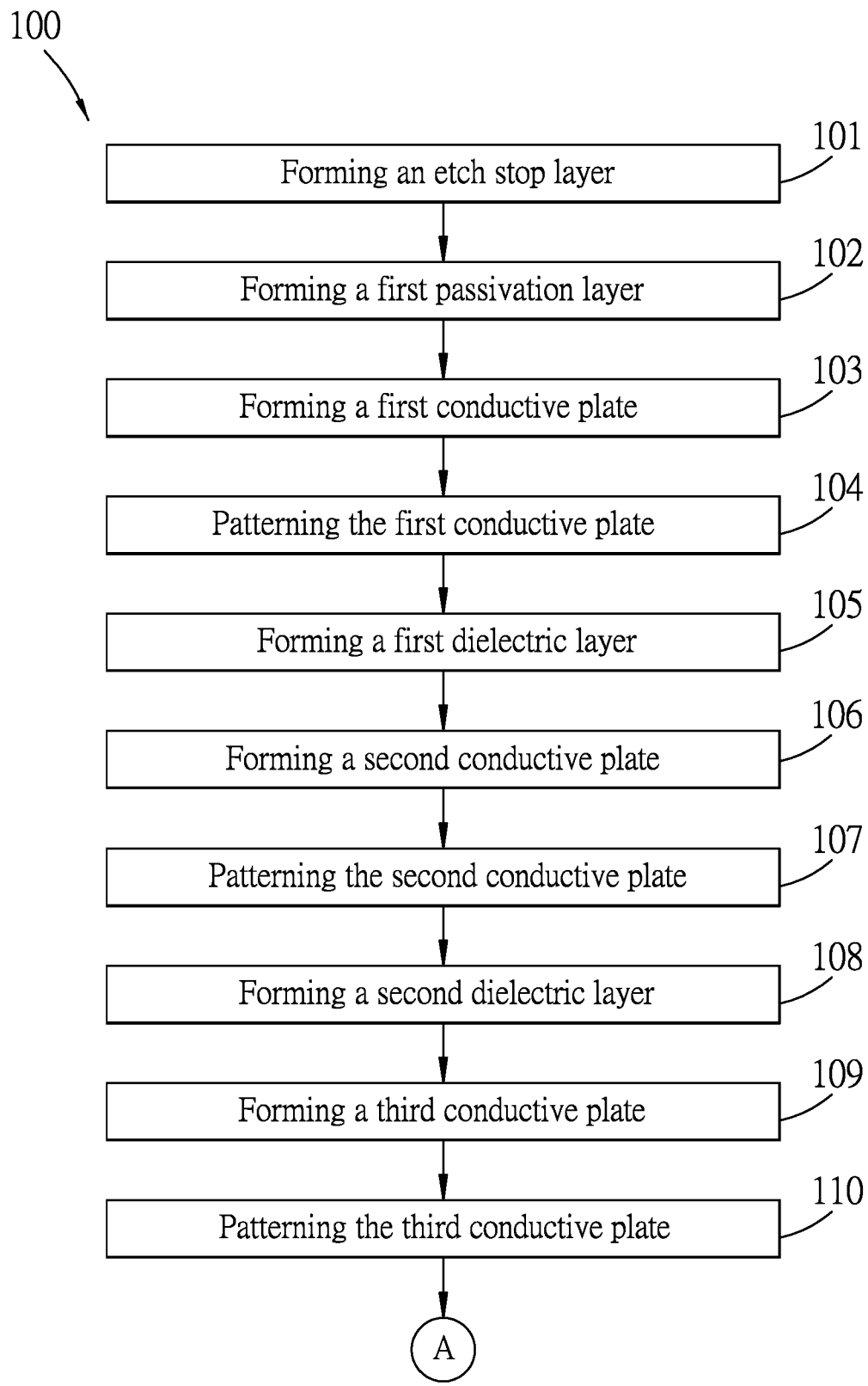
FIGS. 1A and 1B are flow diagrams illustrating a method for manufacturing a semiconductor packaging structure in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "over," "above," "below," "proximate," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be noted that the element(s) or feature(s) are exaggeratedly shown in the figures for the purposed of convenient illustration and are not in scale.

Figure 1B:
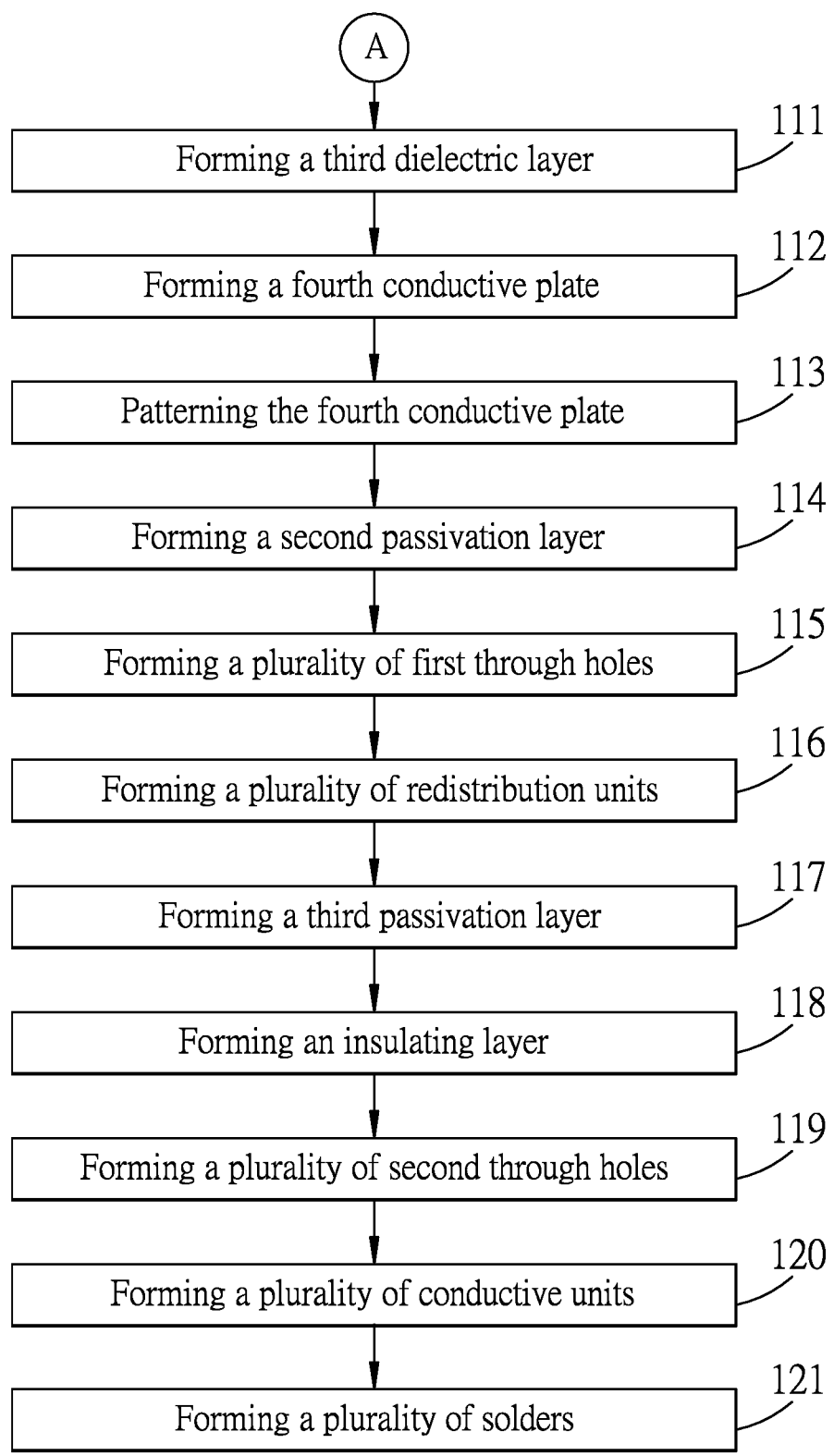

The present disclosure is directed to a semiconductor packaging structure and a method for manufacturing the same. FIGS. 1A and 1B are flow diagrams illustrating a method 100 for manufacturing a semiconductor packaging structure (for example, a semiconductor packaging structure 200 shown in FIG. 22) in accordance with some embodiments. FIGS. 2 to 22 illustrate schematic views of the intermediate stages of the method 100.

Figure 2:
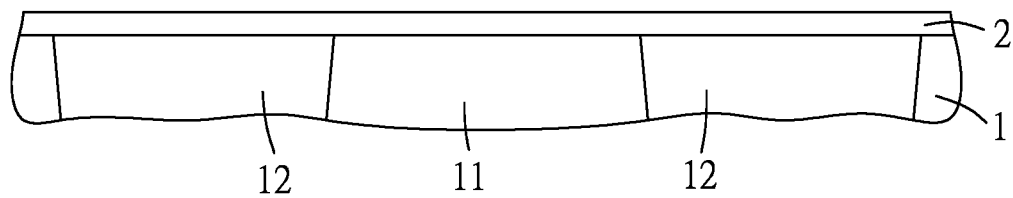
FIGS. 2 to 22 are schematic views illustrating intermediate stages of a method for manufacturing the semiconductor packaging structure in accordance with some embodiments.

Referring to FIGS. 1A and 2, the method 100 begins at step 101, where an etch stop layer 2 is formed on a top interconnect layer 1 of an integrated circuit (IC) substrate (not shown). In some embodiments, the IC substrate may include a semiconductor device and an interconnect structure disposed on the semiconductor device. In some embodiments, the semiconductor device may be a transistor (for example, field-effect transistor etc.), a memory device, other semiconductor devices, or combinations thereof. In some embodiments, the top interconnect layer 1 is a member of the interconnect structure. In some embodiments, the top interconnect layer 1 may include a dielectric layer 11 and a plurality of conductive features 12 formed in the dielectric layer 11. The dielectric layer 11 may include undoped silicate glass (USG), phosphosilicate glass (PSG), borosilicate glass (BSG), boron-doped phosphosilicate glass (BPSG), fluorine-doped silicate glass (FSG), silicon dioxide ($SiO_2$), SiOC-based materials (for example, SiOCH). Other suitable materials for the dielectric layer 11 are within the contemplated scope of the present disclosure. The dielectric layer 11 may be formed by a suitable deposition process, for example, but not limited to, spin-on coating, flowable chemical vapor deposition (FCVD), plasma-enhanced chemical vapor deposition (PECVD), low pressure chemical vapor deposition (LPCVD), atomic layer deposition (ALD), or other suitable deposition processes. The conductive features 12 may be made of a conductive material, for example, but not limited to, copper. Other suitable materials for the conductive features 12 are within the contemplated scope of the present disclosure. The process for forming the conductive features 12 may include (i) patterning the dielectric layer 11 to form a plurality of through holes (not shown), (ii) depositing a conductive material on a top surface of the dielectric layer 11 and in the through holes, and (iii) removing the conductive material on the top surface of the dielectric layer 11 by a planarization process (for example, chemical mechanical planarization (CMP)). The etch stop layer 2 may be made of a nitride-based material (for example, silicon nitride etc.). Other suitable materials for the etch stop layer 2 are within the contemplated scope of the present disclosure. The etch stop layer 2 may be formed by a suitable deposition process, for example, but not limited to, physical vapor deposition (PVD), CVD (for example, PECVD etc.), ALD, or other suitable deposition processes. The etch stop layer 2 may have a thickness ranging from about 400 Å to about 900 Å, and other ranges of values are also within the contemplated scope of the present disclosure.

Figure 3:
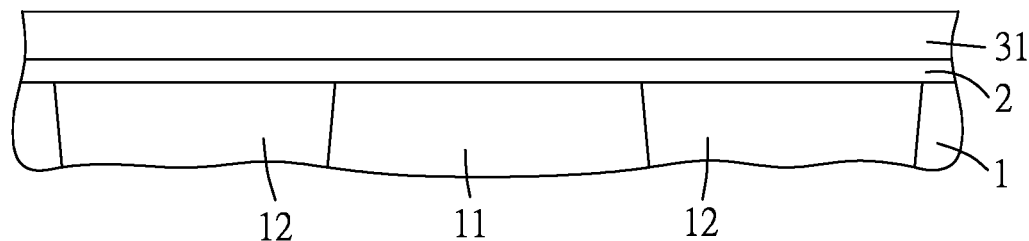

Referring to FIGS. 1A and 3, the method 100 then proceeds to step 102, where a first passivation layer 31 is formed on the etch stop layer 2 opposite to the top interconnect layer 1. The first passivation layer 31 may include, for example, but not limited to, an oxide-based material (for example, USG and silicon oxide etc.), a nitride-based material (for example, silicon nitride etc.), tetraethoxysilane (TEOS), or combinations thereof. Other suitable materials for the first passivation layer 31 are within the contemplated scope of the present disclosure. The first passivation layer 31 may be formed by a suitable deposition process, for example, but not limited to, CVD (for example, high density plasma CVD (HDPCVD)) or other suitable deposition processes. The first passivation layer 31 may have a thickness ranging from about 1000 Å to about 4000 Å, and other ranges of values are also within the contemplated scope of the present disclosure. In some embodiments, the first passivation layer 31 may be formed as a multi-layered structure. For example, the first passivation layer 31 may include a silicon nitride film and an USG film disposed on the silicon nitride film.

Figure 4:
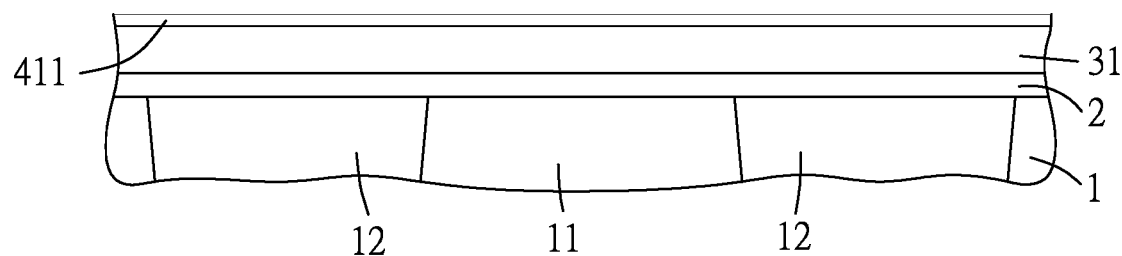

Referring to FIGS. 1A and 4, the method 100 then proceeds to step 103, where a first conductive plate 411 is formed on the first passivation layer 31 opposite to the etch stop layer 2. The first conductive plate 411 may include, but not limited to, titanium nitride (TiN), boron-doped titanium nitride (TiBN), tantalum nitride (TaN), or combinations thereof. Other suitable materials for the first conductive plate 411 are within the contemplated scope of the present disclosure. The first conductive plate 411 may be formed by a suitable deposition process, for example, but not limited to, PVD or other suitable deposition processes.

Figure 5A:
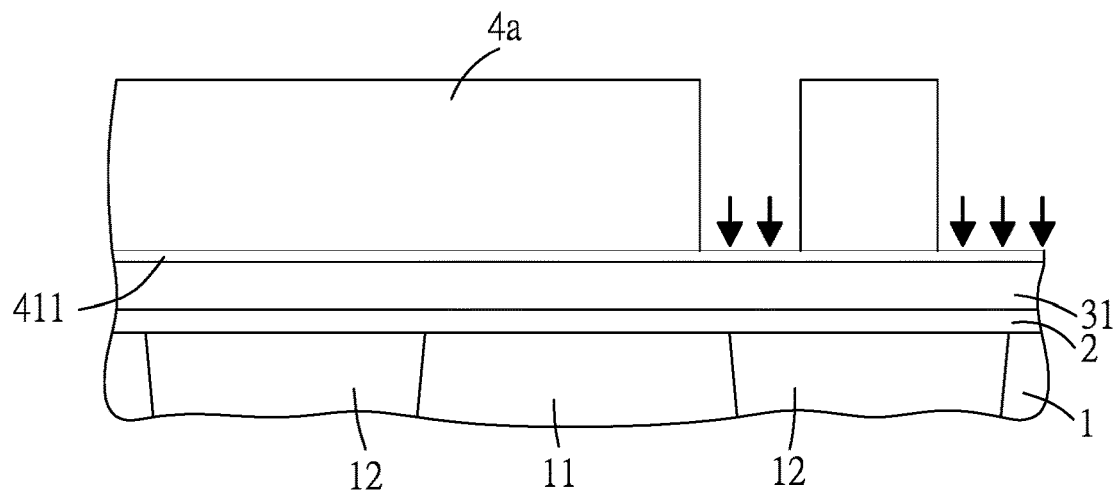
Figure 5B:
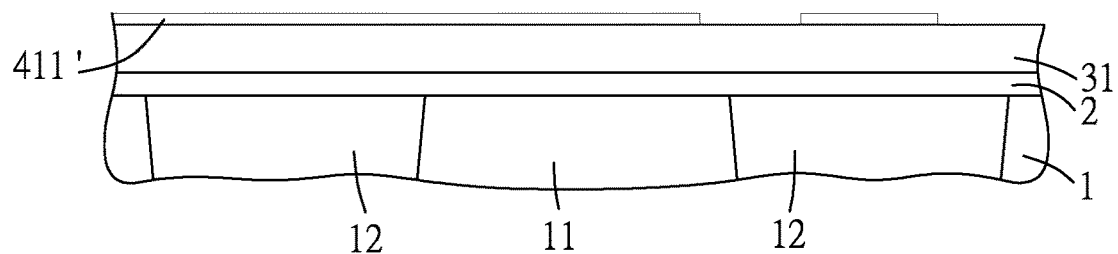

Referring to FIGS. 1A, 5A and 5B, the method 100 then proceeds to step 104, where the first conductive plate 411 is patterned by a photolithography process to expose a portion of the first passivation layer 31. The photolithography process may include coating a photoresist layer, soft-baking the photoresist layer, exposing the photoresist layer through a photomask (not shown), post-exposure baking the photoresist layer, developing the photoresist layer to form a patterned photoresist 4a on the first conductive plate 411, hard-baking the patterned photoresist 4a, and etching the first conductive plate 411 through the patterned photoresist 4a (see FIG. 5A). The etching process may be conducted using, for example, but not limited to, a dry etching process, a wet etching process, other suitable etching processes, or combinations thereof. After the etching process, the patterned photoresist 4a may be removed using, for example, but not limited to, a dry etching process, a wet etching process, CMP, other suitable processes, or combinations thereof. After this step, the first conductive plate 411 is formed into a patterned first conductive plate 411', and a portion of the first passivation layer 31 is exposed from the patterned first conductive plate 411' (see FIG. 5B).

Figure 6:
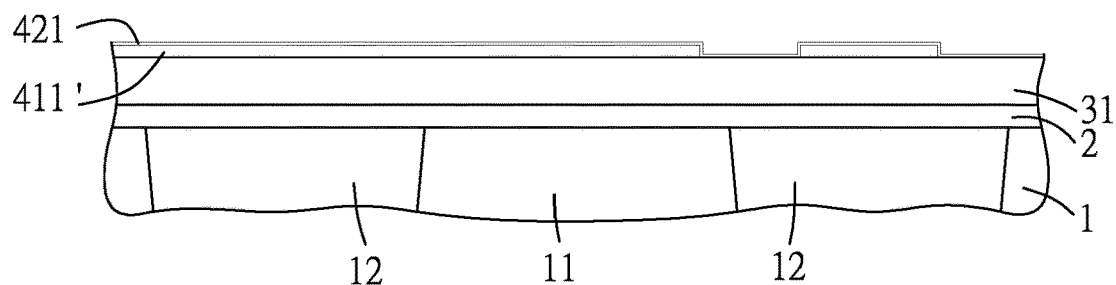

Referring to FIGS. 1A and 6, the method 100 then proceeds to step 105, where a first dielectric layer 421 is conformally formed over the structure of FIG. 5B. The first dielectric layer 421 is disposed on the exposed portion of the first passivation layer 31 and the patterned first conductive plate 411'. The first dielectric layer 421 may include, but not limited to, hafnium oxide (HfO$_2$), aluminum oxide (Al$_2$O$_3$), zirconia (ZrO$_2$), other high dielectric constant (k) dielectric materials, or combinations thereof. Other suitable materials for the first dielectric layer 421 are within the contemplated scope of the present disclosure. The first dielectric layer 421 may be formed by a suitable deposition process, for example, but not limited to, CVD, PVD, ALD, or other suitable deposition processes.

Figure 7:
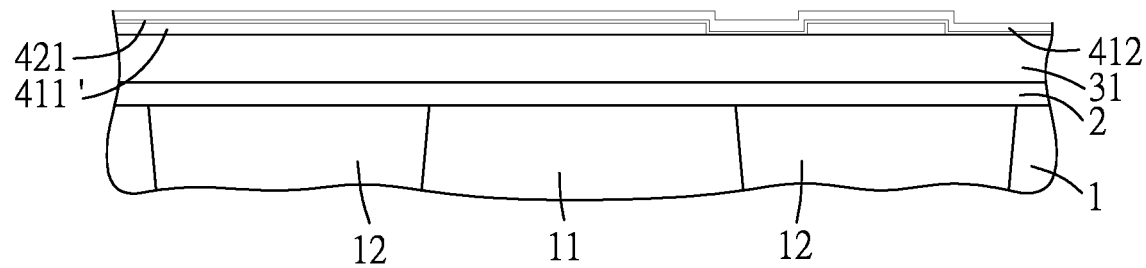

Referring to FIGS. 1A and 7, the method 100 then proceeds to step 106, where a second conductive plate 412 is conformally formed on the first dielectric layer 421. The material and process for forming the second conductive plate 412 are the same as or similar to those used for forming the first conductive plate 411 as described in step 103, and thus details thereof are omitted for the sake of brevity.

Figure 8A:
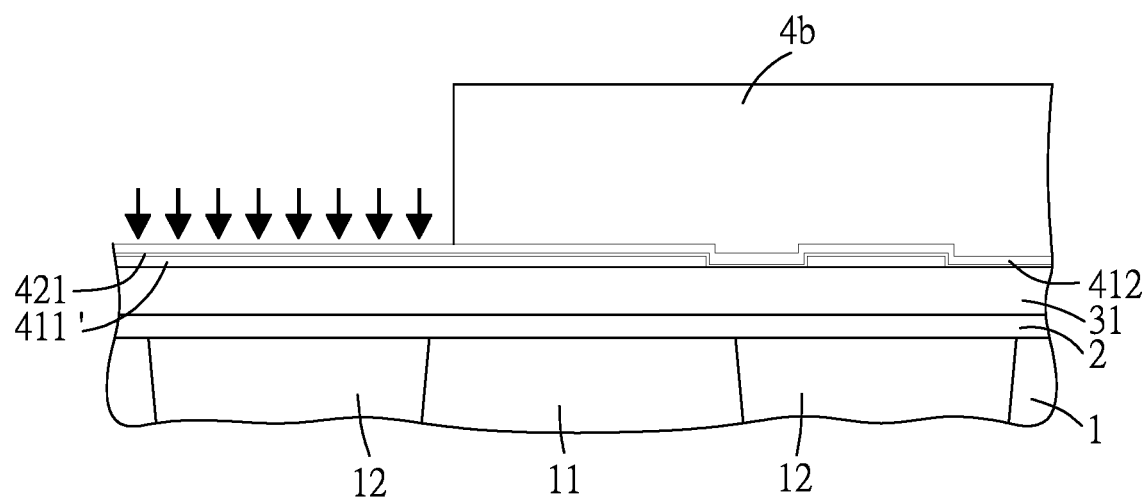
Figure 8B:
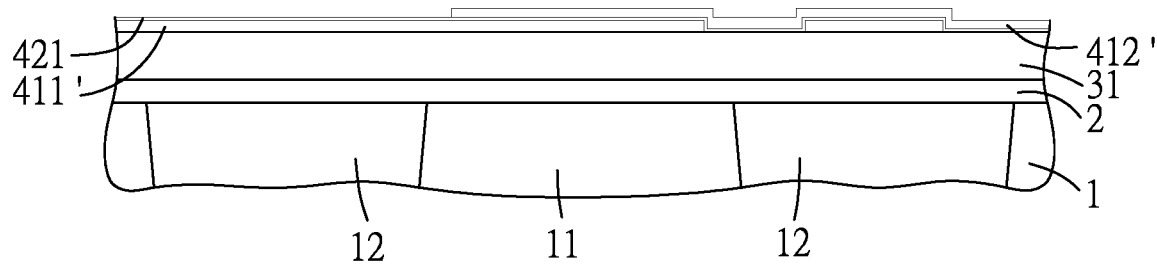

Referring to FIGS. 1A, 8A and 8B, the method 100 then proceeds to step 107, where the second conductive plate 412 is patterned by a photolithography process. The photolithography process may include coating a photoresist layer, soft-baking the photoresist layer, exposing the photoresist layer through a photomask (not shown), post-exposure baking the photoresist layer, developing the photoresist layer to form a patterned photoresist 4b on the second conductive plate 412, hard-baking the patterned photoresist 4b, and etching the second conductive plate 412 through the patterned photoresist 4b (see FIG. 8A). After the etching process, the patterned photoresist 4b may be removed using, for example, but not limited to, a dry etching process, a wet etching process, CMP, other suitable processes, or combinations thereof. After this step, the second conductive plate 412 is formed into a patterned second conductive plate 412', and a portion of the first dielectric layer 421 is exposed from the patterned second conductive plate 412' (see FIG. 8B).

Figure 9:
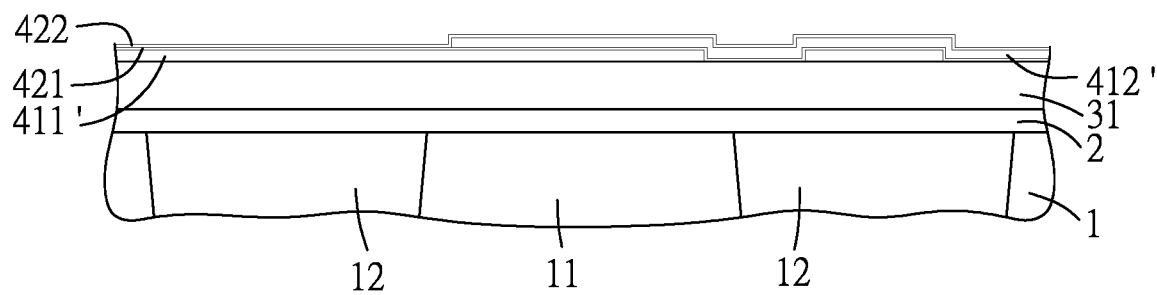

Referring to FIGS. 1A and 9, the method 100 then proceeds to step 108, where a second dielectric layer 422 is conformally formed over the structure of FIG. 8B. The second dielectric layer 422 is disposed on an exposed portion of the first dielectric layer 421 and a patterned second conductive plate 412' obtained in step 107. The material and process for forming the second dielectric layer 422 are the same as or similar to those used for forming the first dielectric layer 421 as described in step 105, and thus details thereof are omitted for the sake of brevity.

Figure 10:
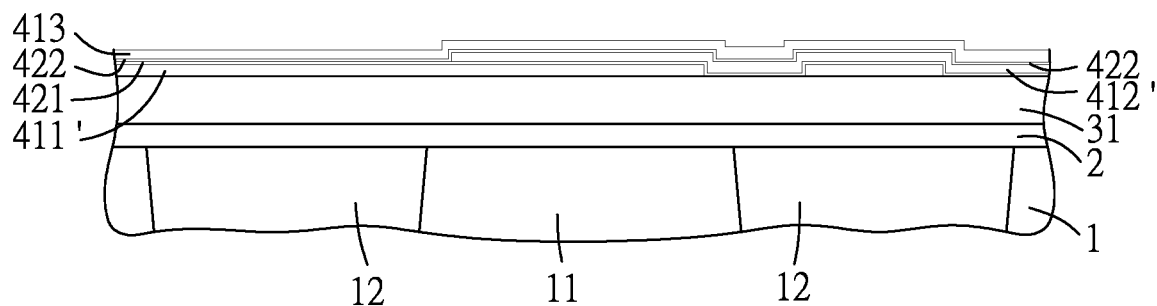

Referring to FIGS. 1A and 10, the method 100 then proceeds to step 109, where a third conductive plate 413 is conformally formed on the second dielectric layer 422. The material and process for forming the third conductive plate 413 are the same as or similar to those used for forming the first conductive plate 411 as described in step 103, and thus details thereof are omitted for the sake of brevity.

Figure 11A:
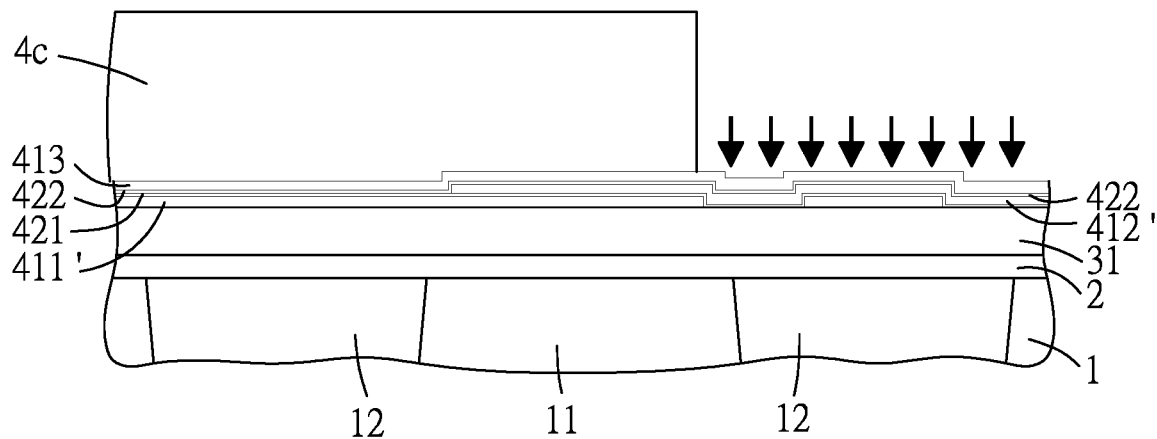
Figure 11B:
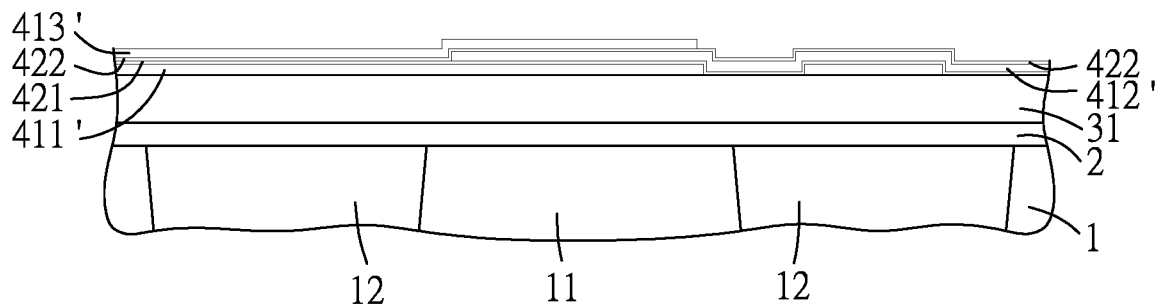

Referring to FIGS. 1A, 11A and 11B, the method 100 then proceeds to step 110, where the third conductive plate 413 is patterned by a photolithography process. The photolithography process may include coating a photoresist layer, soft-baking the photoresist layer, exposing the photoresist layer through a photomask (not shown), post-exposure baking the photoresist layer, developing the photoresist layer to form a patterned photoresist 4c on the third conductive plate 413, hard-baking the patterned photoresist 4c, and etching the third conductive plate 413 through the patterned photoresist 4c (see FIG. 11A). After the etching process, the patterned photoresist 4c is removed using, for example, but not limited to, a dry etching process, a wet etching process, CMP, other suitable processes, or combinations thereof. After this step, the third conductive plate 413 is formed into a patterned third conductive plate 413', and a portion of the second dielectric layer 422 is exposed from the patterned third conductive plate 413' (see FIG. 11B).

Figure 12:
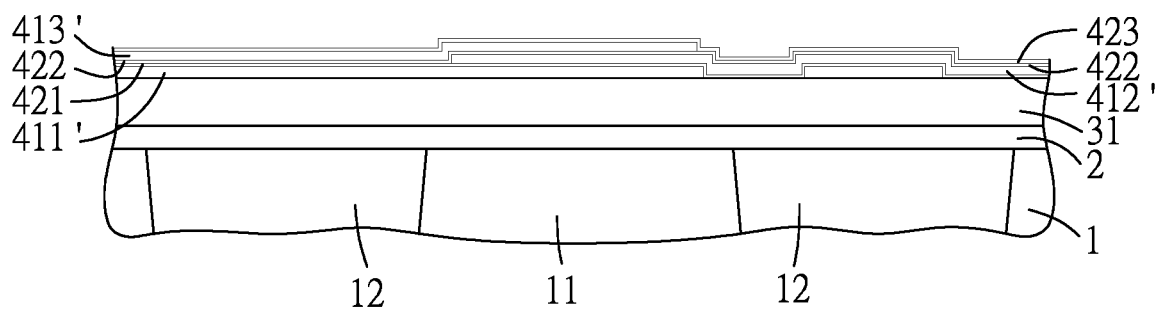

Referring to FIGS. 1B and 12, the method 100 then proceeds to step 111, where a third dielectric layer 423 is conformally formed over the structure of FIG. 11B. The third dielectric layer 423 is disposed on an exposed portion of the second dielectric layer 422 and a patterned third conductive plate 413' obtained in step 110. The material and process for forming the third dielectric layer 423 are the same as or similar to those used for forming the first dielectric layer 421 as described in step 105, and thus details thereof are omitted for the sake of brevity.

Figure 13:
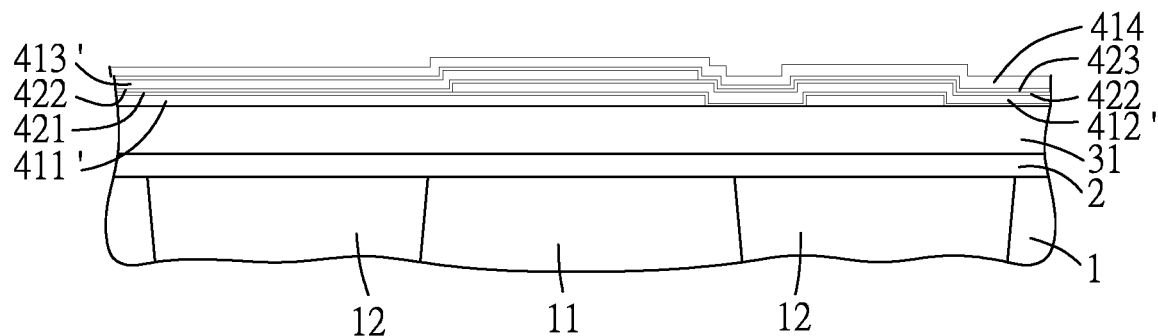

Referring to FIGS. 1B and 13, the method 100 then proceeds to step 112, where a fourth conductive plate 414 is conformally formed on the third dielectric layer 423. The material and process for forming the fourth conductive plate 414 are the same as or similar to those used for forming the first conductive plate 411 as described in step 103, and thus details thereof are omitted for the sake of brevity.

Figure 14A:
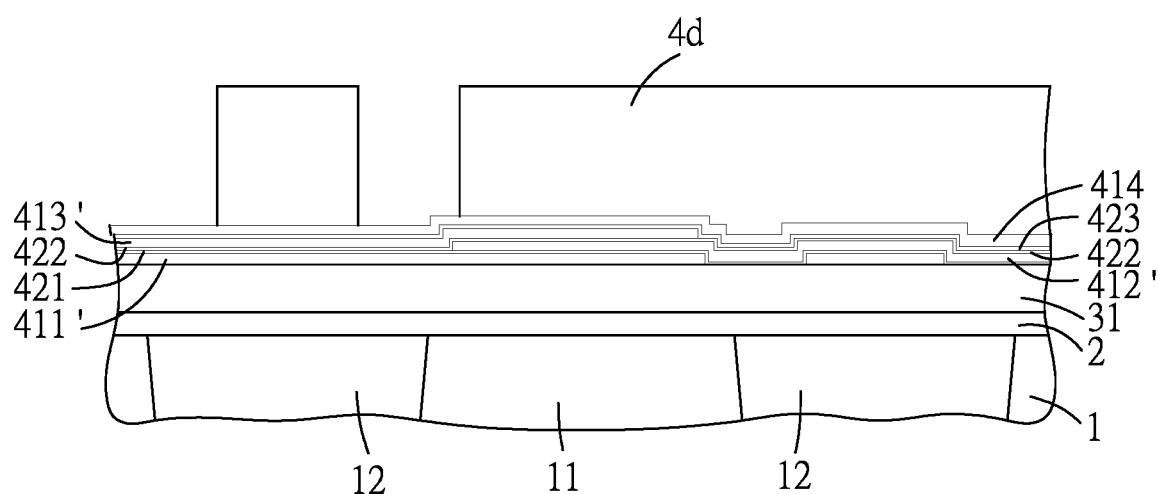
Figure 14B:
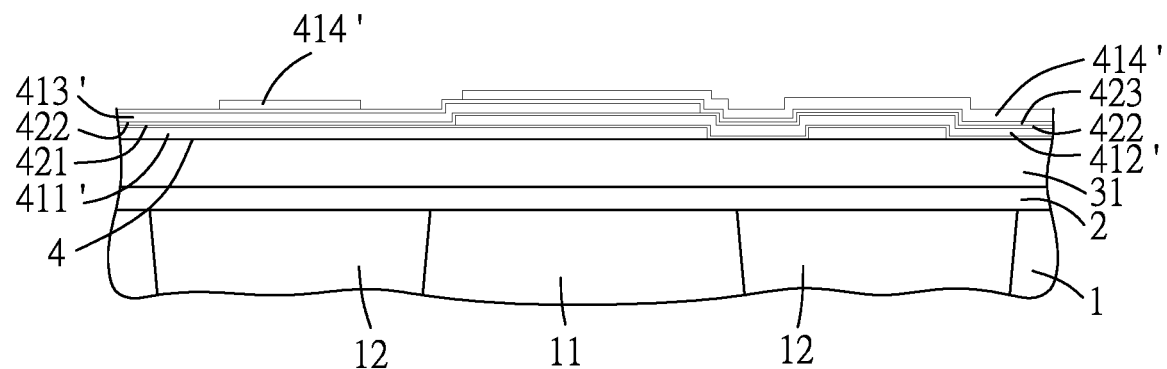

Referring to FIGS. 1B, 14A and 14B, the method 100 then proceeds to step 113, where the fourth conductive plate 414 is patterned by a photolithography process. The photolithography process may include coating a photoresist layer, soft-baking the photoresist layer, exposing the photoresist layer through a photomask (not shown), post-exposure baking the photoresist layer, developing the photoresist layer to form a patterned photoresist 4d on the fourth conductive plate 414, hard-baking the patterned photoresist 4d, and etching the fourth conductive plate 414 through the patterned photoresist 4d (see FIG. 14A). After the etching process, the patterned photoresist 4d is removed using, for example, but not limited to, a dry etching process, a wet etching process, CMP, other suitable processes, or combinations thereof. After this step, the fourth conductive plate 414 is formed into a patterned fourth conductive plate 414' and a portion of the third dielectric layer 423 is exposed from the patterned fourth conductive plate 414' (see FIG. 14B). The patterned first conductive plate 411', the first dielectric layer 421, the patterned second conductive plate 412', the second dielectric layer 422, the patterned third conductive plate 413', the third dielectric layer 423, and the patterned fourth conductive plate 414' cooperate to form a capacitor structure 4 having a plurality of metal-insulator-metal (MIM) units.

Figure 15:
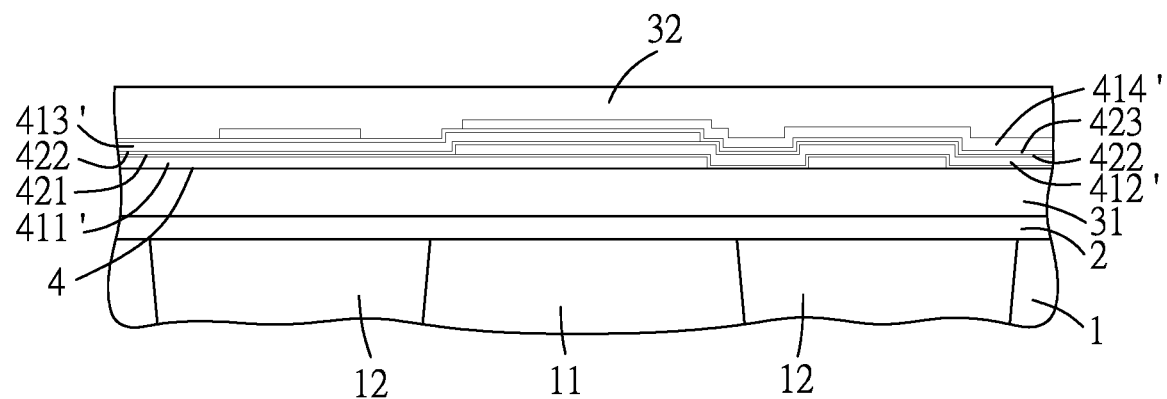

Referring to FIGS. 1B and 15, the method 100 then proceeds to step 114, where a second passivation layer 32 is conformally formed over the capacitor structure 4 of FIG. 14B. The second passivation layer 32 may include, for example, but not limited to, an oxide-based material (for example, USG and silicon oxide etc.), a nitride-based material (for example, silicon nitride etc.), tetraethoxysilane (TEOS), or combinations thereof. Other suitable materials for the second passivation layer 32 are within the contemplated scope of the present disclosure. The second passivation layer 32 may be formed by CVD with parameters to enhance the stress (for example, compressive stress) of the second passivation layer 32. In some embodiments, the CVD may be a plasma-based CVD. In some embodiments, the plasma-based CVD may be PECVD, HDPCVD, or inductively coupled plasma chemical vapor deposition (ICP-CVD). In some embodiments, a plasma gas used in the plasma-based CVD (for example, PECVD) may be, for example, but not limited to, nitrous oxide ($N_2O$), ammonia ($NH_3$) or other suitable gases. In some embodiments, a precursor used for forming the second passivation layer 32 may be silane ($SiH_4$). In some embodiments, the precursor gas flow rate may range from about 250 sccm to about 850 sccm. In some embodiments, the parameters may include a plasma generation power that is greater than about 900 W. In some embodiments, the plasma generation power is greater than about 900 W and is not greater than about 1500 W. In some embodiments, the parameters may include a temperature during deposition ranging from about 300° C. to about 500° C. In some embodiments, the parameters may include a pressure during deposition ranging from about 2.0 Torr to about 5.0 Torr. The second passivation layer 32 may have a thickness ranging from about 5000 Å to about 8000 Å, and other ranges of values are also within the contemplated scope of the present disclosure. The second passivation layer 32 may have enhanced compressive stress that is smaller than about −0.3 GPa. In some embodiments, the second passivation layer 32 may have the compressive stress that is smaller than about −0.3 GPa and that is not smaller than about −0.6 GPa.

Figure 16A:
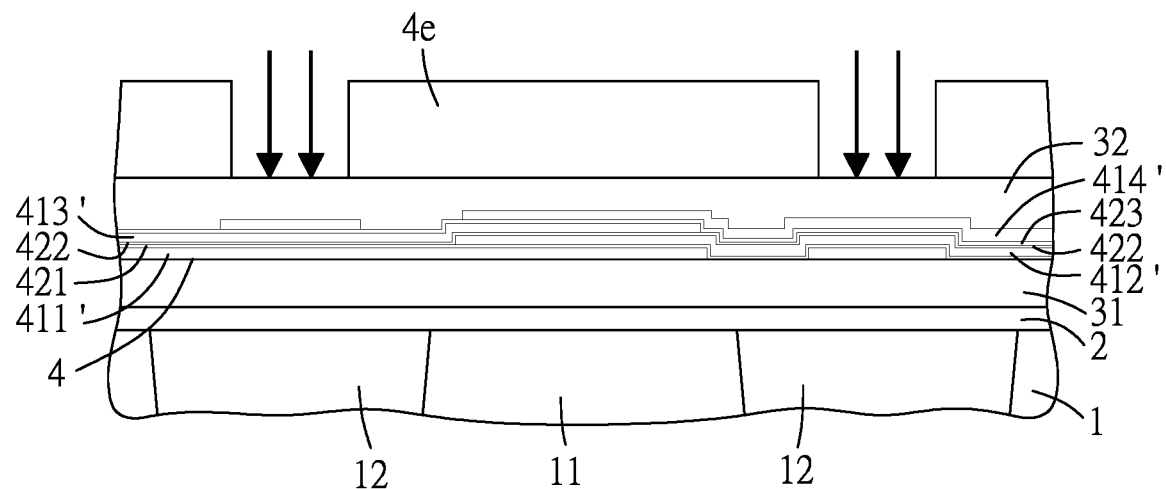
Figure 16B:
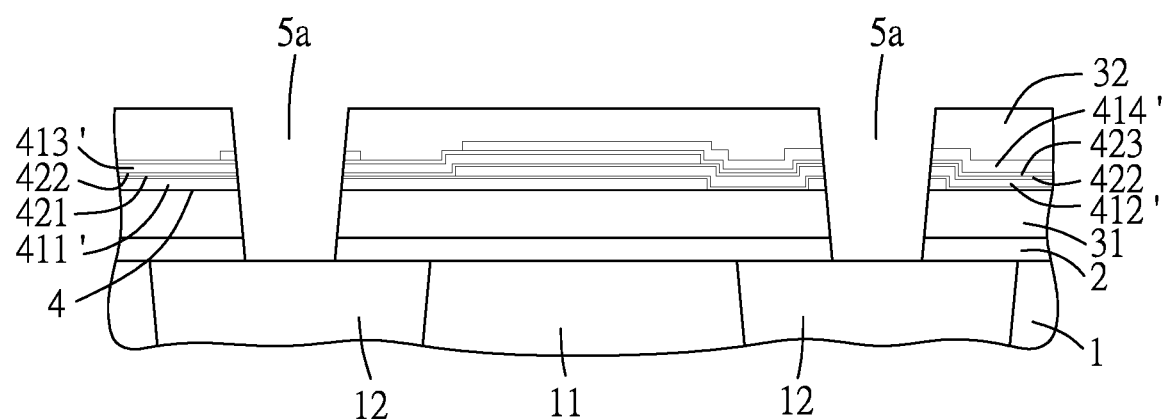

Referring to FIGS. 1B, 16A and 16B, the method 100 then proceeds to step 115, where a plurality of first through holes 5a are formed. Each of the first through holes 5a penetrates through the second passivation layer 32, the capacitor structure 4, the first passivation layer 31 and the etch stop layer 2, and terminates at the conductive features 12 to expose the conductive features 12. Step 115 may be conducted using a photolithography process. The photolithography process may include coating a photoresist layer, soft-baking the photoresist layer, exposing the photoresist layer through a photomask (not shown), post-exposure baking the photoresist layer, developing the photoresist layer to form a patterned photoresist 4e on the second passivation layer 32, hard-baking the patterned photoresist 4e, and etching the second passivation layer 32, the capacitor structure 4, the first passivation layer 31 and the etch stop layer 2 through the patterned photoresist 4e (see FIG. 16A). After formation of the first through holes 5a, the patterned photoresist 4e is removed using, for example, but not limited to, dry etching, wet etching, CMP, or other suitable processes (see FIG. 16B). In some embodiments, each of the first through holes 5a may have a cross-section of an inverted trapezoid shape.

Figure 17A:
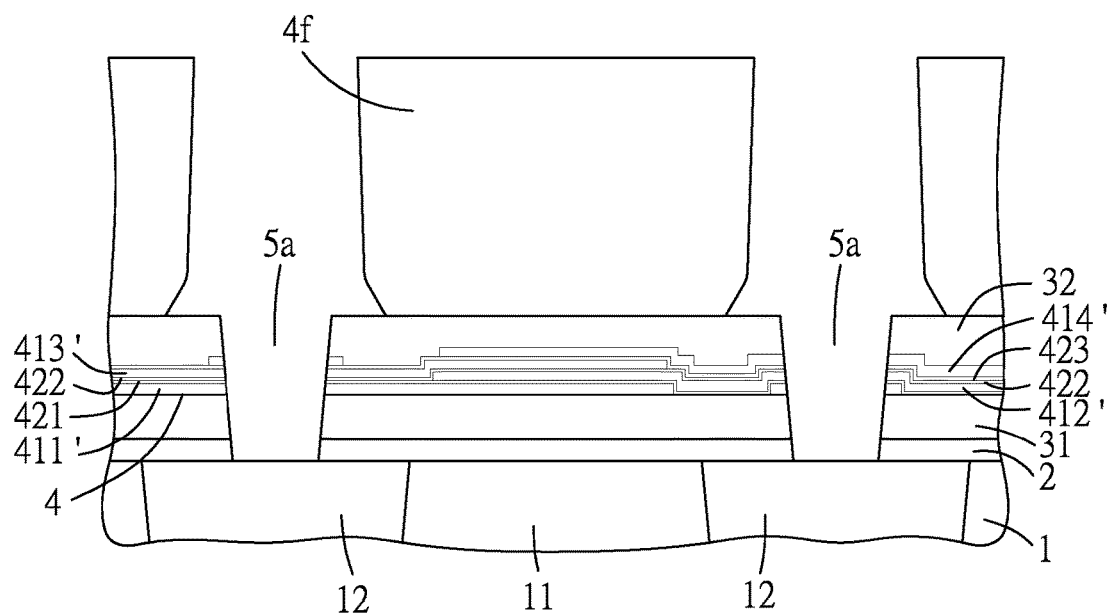
Figure 17B:
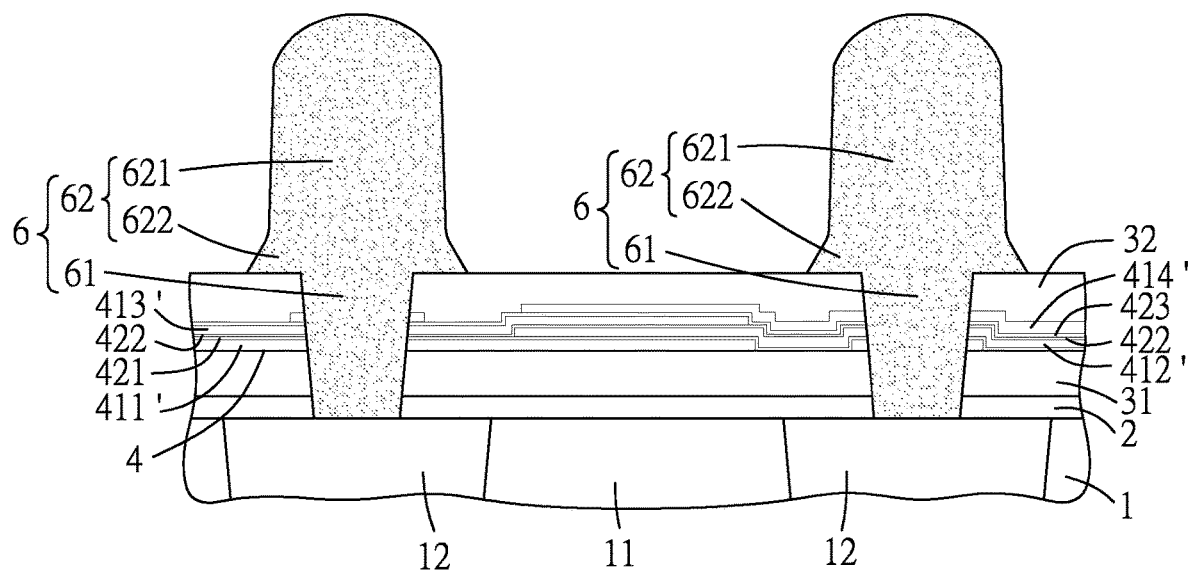

Referring to FIGS. 1B, 17A and 17B, the method 100 then proceeds to step 116, where a plurality of redistribution units 6 are formed. Step 116 may include (i) depositing a photoresist layer in the first through holes 5a and on a top surface of the second passivation layer 32, soft-baking the photoresist layer, exposing the photoresist layer through a photomask, post-exposure baking the photoresist layer, and developing and hard-baking the photoresist layer to form a patterned photoresist 4f which is disposed on the top surface of the second passivation layer 32 and which exposes the first through holes 5a (see FIG. 17A), (ii) depositing a redistribution material layer on the structure of FIG. 17A (i.e., in the first through holes 5a and spaces among the patterned photoresist 4f) by a suitable fabrication process, for example, but not limited to, plating or other suitable fabrication processes, and (iii) removing the patterned photoresist 4f by dry etching, wet etching or a combination thereof, so as to obtain the redistribution units 6 (see FIG. 17B). The redistribution units 6 may be made of a metal, for example, but not limited to, aluminum. Other suitable materials for the redistribution units 6 are within the contemplated scope of the present disclosure. In some embodiments, each of the redistribution units 6 may include a main body 61 and an extending body 62 extending upwardly from the main body 61. The main body 61 of each of the redistribution units 6 is formed in a corresponding one of the first through holes 5a, and is disposed on and electrically connected to a corresponding one of the conductive features 12. In some embodiments, the main body 61 may have a cross-section of an inverted trapezoid shape. In some embodiments, the extending body 62 may have an upper portion 621 and a lower portion 622 located between the main body 61 and the upper portion 621. The lower portion 622 is disposed on the main body 61 and the second passivation layer 32, and contacts a part of an upper surface of the second passivation layer 32, so that adhesion between each of the redistribution units 6 and the second passivation layer 32 can be enhanced.

Figure 18:
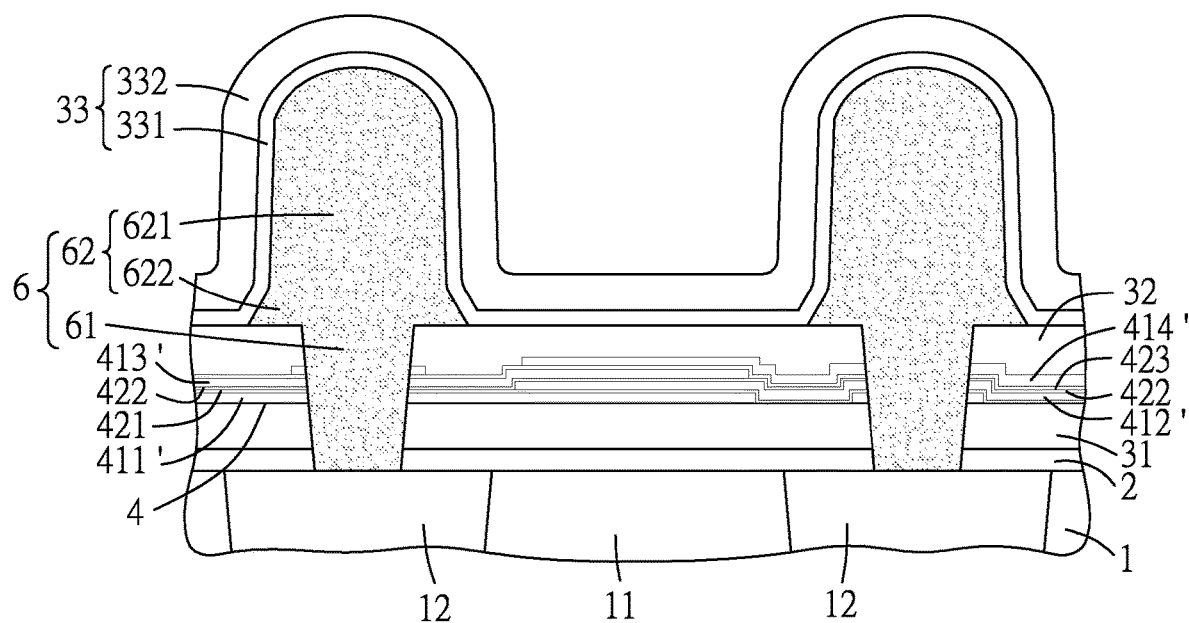

Referring to FIGS. 1B and 18, the method 100 then proceeds to step 117, where a third passivation layer 33 is conformally formed over the structure of FIG. 17B. The third passivation layer 33 is conformally formed on the second passivation layer 32 and the redistribution units 6. The third passivation layer 33 may include, for example, but not limited to, an USG, an oxide-based material, a nitride-based material (for example, silicon nitride), or combinations thereof. The third passivation layer 33 may be formed by a suitable deposition process, for example, but not limited to, CVD or other suitable deposition processes. In some embodiments, the oxide-based material may be formed by, for example, but not limited to, HDPCVD. The third passivation layer 33 may have a thickness ranging from about 10000 Å to about 29000 Å. In some embodiments, the third passivation layer 33 may be formed as a multi-layered structure. For example, the third passivation layer 33 may have a first sub-layer 331 disposed on the second passivation layer 32 and the redistribution units 6, and a second sub-layer 332 disposed on and covering the first sub-layer 331. In some embodiments, the first sub-layer 331 of the third passivation layer 33 may have a thickness ranging from about 10000 Å to about 19000 Å, and the second sub-layer 332 of the third passivation layer 33 may have a thickness ranging from about 5000 Å to about 10000 Å. In some embodiments, the first sub-layer 331 of the third passivation layer 33 may contain an oxide film and an USG film on the oxide film. In such cases, the oxide film may have a thickness ranging from about 10000 Å to about 15000 Å, and the USG film may have a thickness ranging from about 1000 Å to about 4000 Å. In some embodiments, the second sub-layer 332 of the third passivation layer 33 may be a silicon nitride film, and may have a thickness ranging from about 5000 Å to about 10000 Å.

Figure 19:
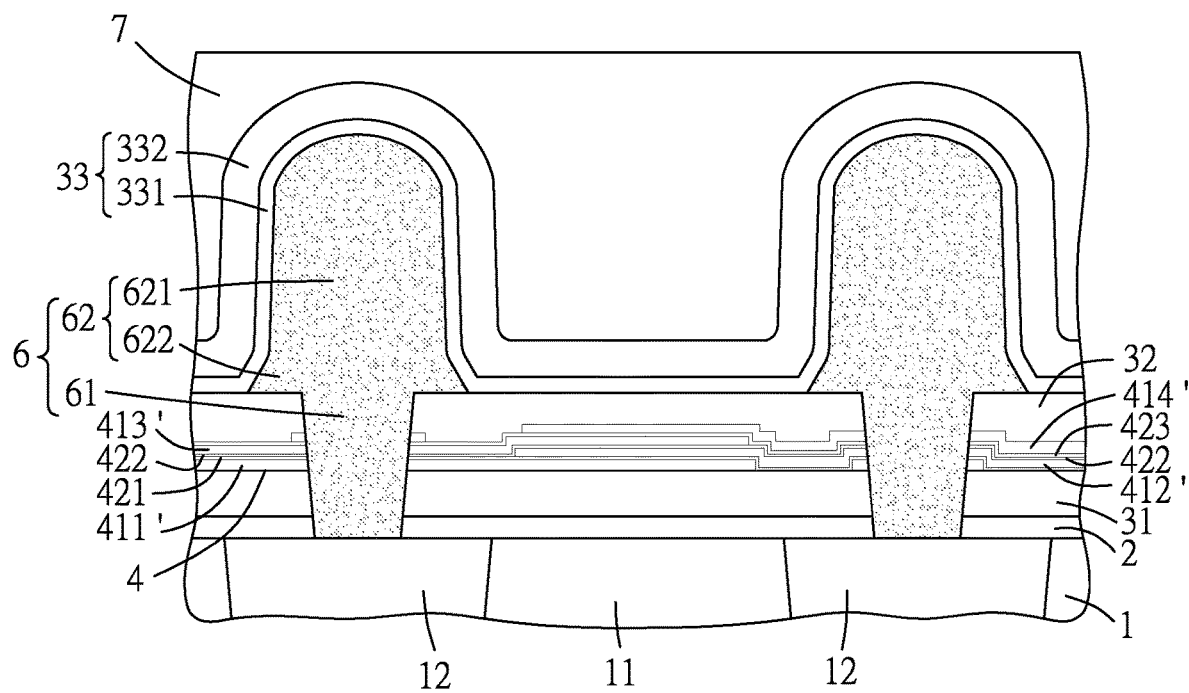

Referring to FIGS. 1B and 19, the method 100 then proceeds to step 118, where an insulating layer 7 is formed over the structure of FIG. 18 (i.e., on the third passivation layer 33). The insulating layer 7 may be made of an organic material, for example, but not limited to, polyimide (PI). Other suitable materials for the insulating layer 7 are within the contemplated scope of the present disclosure. The insulating layer 7 may be formed on the third passivation layer 33 by a suitable fabrication process, for example, but not limited to, spin-on coating. The insulating layer 7 may have a thickness ranging from about 10 μm to about 30 μm, and other ranges of values are also within the contemplated scope of the present disclosure. In some embodiments, a baking process is conducted to bake the insulating layer 7 after coating the insulating layer 7.

Figure 20:
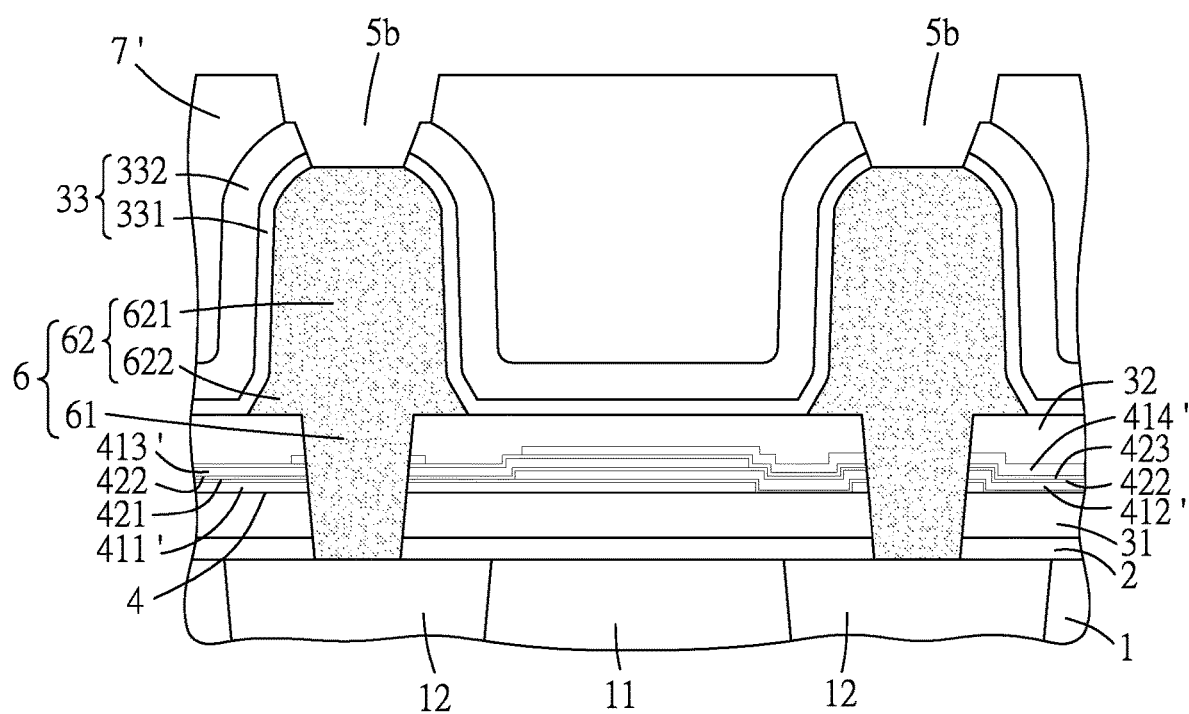

Referring to FIGS. 1B and 20, the method 100 then proceeds to step 119, where a plurality of second through holes 5b are formed. Each of the second through holes 5b penetrates through the insulating layer 7 and the third passivation layer 33, and terminates at the upper portion 621 of a corresponding one of the redistribution units 6. Step 119 may include (i) exposing the insulating layer 7 through a photomask (not shown), developing the insulating layer 7 followed by curing, so as to obtain a patterned insulating layer 7' having a plurality of recesses, and then (ii) removing a portion of the third passivation layer 33 through the recesses to expose the upper portion 621 of each of the redistribution units 6 by, for example, dry etching, wet etching or a combination thereof, so as to obtain the second through holes 5b. In this embodiment, the upper portion 621 of each of the redistribution units 6 may be slightly etched.

Figure 21:
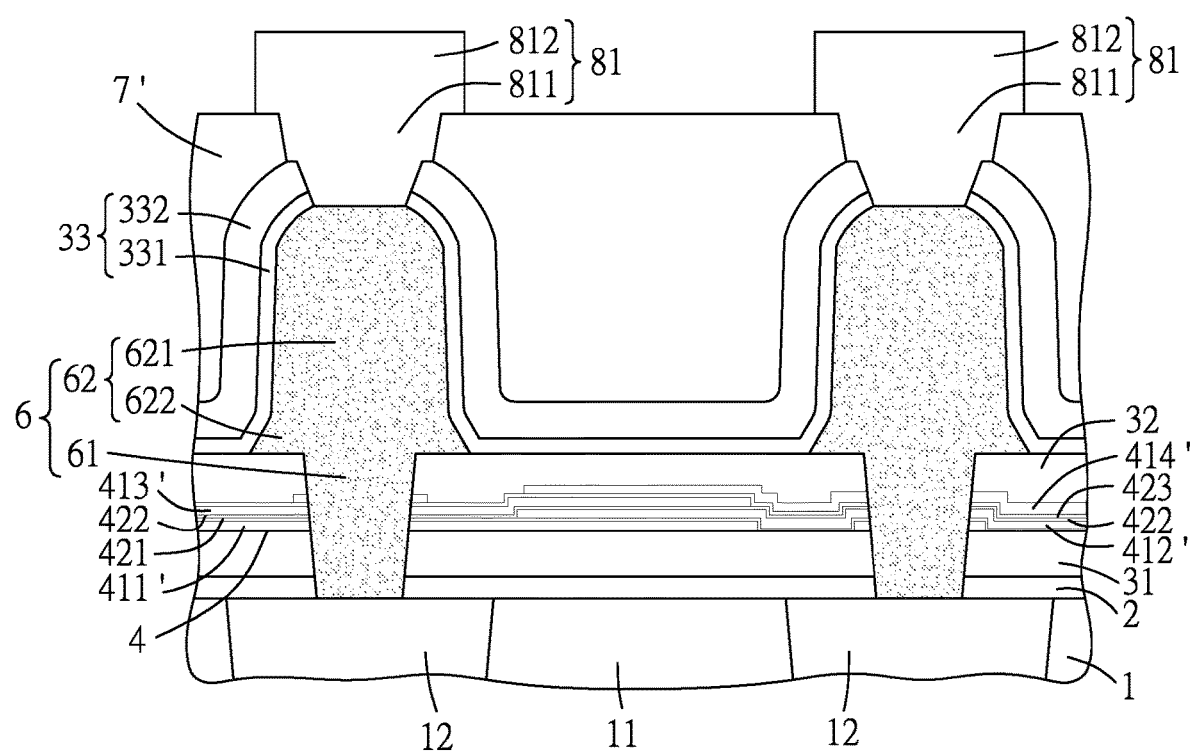

Referring to FIGS. 1B and 21, the method 100 then proceeds to step 120, where a plurality of conductive units 81 are formed. Each of the conductive units 81 includes a lower conductive portion 811 and an upper conductive portion 812. The lower conductive portion 811 of each of the conductive units 81 is formed in a corresponding one of the second through holes 5b (see FIG. 20), and is disposed on the upper portion 621 of a corresponding one of the redistribution units 6. The upper conductive portion 812 extends upwardly from the lower conductive portion 811 oppositely of the corresponding one of the redistribution units 6. Step 120 may include (i) depositing a conductive material layer on the patterned insulating layer 7' and in the second through holes 5b, and (ii) patterning the conductive material layer by a photolithography process, so as to remove a part of the conductive material layer on the patterned insulating layer 7', thereby obtaining the conductive units 81. The conductive material layer may be made of a metal, for example, but not limited to, copper. Other suitable materials for the conductive material layer are within the contemplated scope of the present disclosure. The conductive material layer may be formed by a suitable deposition process, for example, but not limited to, CVD, PVD, ALD, or other suitable deposition processes.

Figure 22:
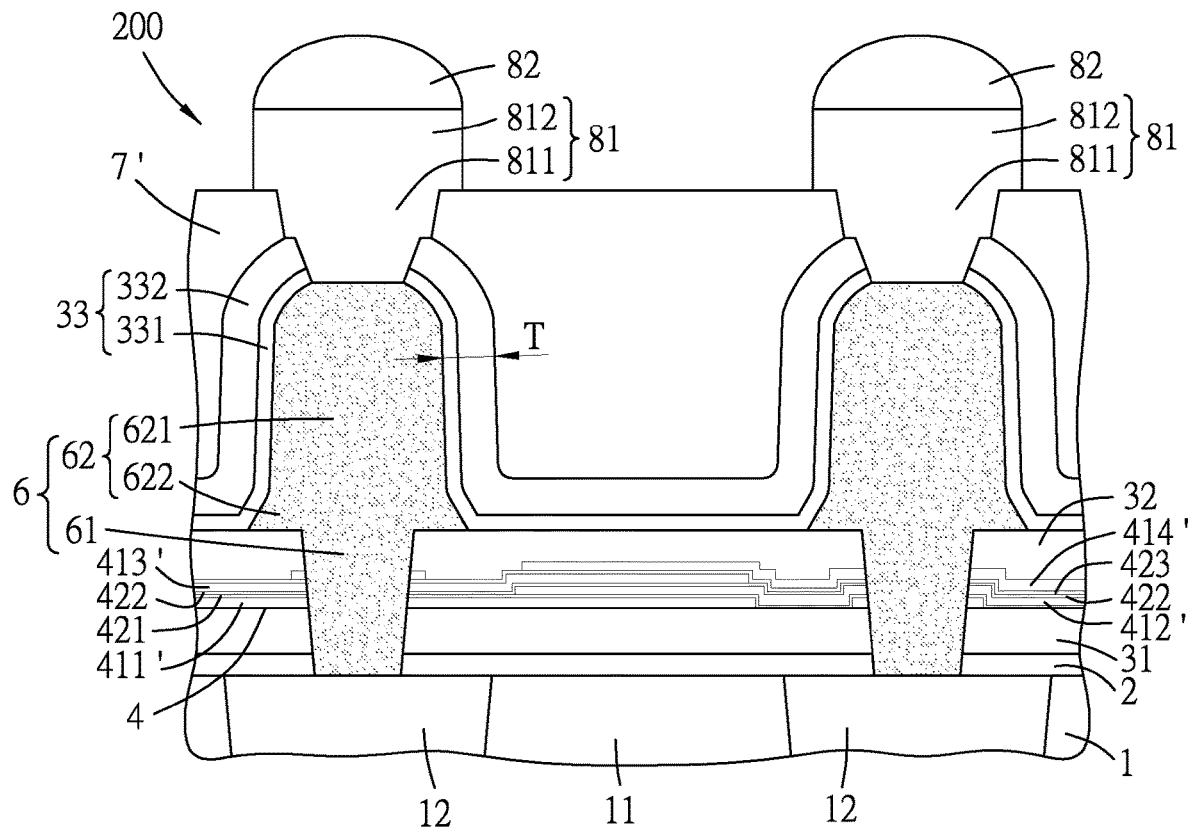

Referring to FIGS. 1B and 22, the method 100 then proceeds to step 121, where a plurality of solders 82 are formed on the upper conductive portion 812 of the conductive units 81, respectively. The solders 82 may be made of, for example, but not limited to, copper, nickel, silver, bismuth, tin, and combinations thereof. Other suitable materials for the solders 82 are within the contemplated scope of the present disclosure. The solders 82 may be formed by a suitable fabrication process, for example, but not limited to, plating, ball drop process or other suitable processes. In some embodiments, each of the solders 82 and a corresponding one of the conductive units 81 cooperate to form a bonding pad. After step 121, the semiconductor packaging structure 200 is obtained.

With the aforesaid parameters of CVD used to form the second passivation layer 32 of the semiconductor packaging structure 200, the compressive stress of the second passivation layer 32 can be enhanced (for example, a range of smaller than about −0.3 GPa to about −0.6 GPa), thereby preventing delamination of the capacitor structure 4 in the subsequent manufacturing processes. In other words, the capacitor structure 4 may not be adversely affected by external stresses during subsequent manufacturing processes. As such, the number of the MIM units may be increased (i.e., a keep-out zone (KOZ) of the IC substrate decreases) depending on application needs.

In some embodiments, the thickness (T) of the third passivation layer 33 of the semiconductor packaging structure 200 (see FIG. 22) may range from about 30000 Å to about 60000 Å, which is conducive for increasing the stress tolerance of the third passivation layer 33 and preventing cracks forming in the third passivation layer 33 when the semiconductor packaging structure 200 is subjected to a thermal test (for example, thermal cycling test (TCT) or high temperature storage (HTS) test) or a stress test (for example, unbiased highly accelerated stress test (uHAST)). In some embodiments, in step 114, the second passivation layer 32 may be formed by CVD using process parameters known in the art, and the compressive stress issue should not be considered.

In this disclosure, by increasing the thickness of the third passivation layer 33 of the semiconductor packaging structure 200, the stress tolerance of the third passivation layer 33 can be enhanced, thereby effectively avoiding cracks forming in the third passivation layer 33. Moreover, by using the aforesaid process parameters of CVD to form the second passivation layer 32 of the semiconductor packaging structure 200, the compressive stress of the second passivation layer 22 can be increased (for example, a range of smaller than about −0.3 GPa to about −0.6 GPa), thereby effectively avoiding the delamination of the capacitor structure 4. Therefore, the number of the MIM units can be increased to meet application needs.

In accordance with some embodiments of the present disclosure, a method for manufacturing a semiconductor packaging structure includes: forming a first passivation layer; forming a capacitor structure on the first passivation layer; and forming a second passivation layer on the capacitor structure opposite to the first passivation layer, the second passivation layer being formed by chemical vapor deposition with parameters such that the compressive stress of the second passivation layer is smaller than −0.3 GPa.

In accordance with some embodiments of the present disclosure, the compressive stress of the second passivation layer is smaller than −0.3 GPa and is not smaller than −0.6 GPa.

In accordance with some embodiments of the present disclosure, the parameters include a pressure ranging from 2.0 Torr to 5.0 Torr.

In accordance with some embodiments of the present disclosure, the chemical vapor deposition is a plasma-based chemical vapor deposition.

In accordance with some embodiments of the present disclosure, a gas plasma used in the plasma-based chemical vapor deposition includes ammonia ($NH_3$) or nitrous oxide ($N_2O$).

In accordance with some embodiments of the present disclosure, a plasma generation power is greater than 900 W.

In accordance with some embodiments of the present disclosure, the plasma generation power is greater than 900 W and is not greater than 1500 W.

In accordance with some embodiments of the present disclosure, the method for manufacturing a semiconductor packaging structure further includes: after the step of forming the second passivation layer, forming a third passivation layer on the second passivation layer opposite to the capacitor structure, the third passivation layer having a thickness ranging from 30000 Å to 60000 Å.

In accordance with some embodiments of the present disclosure, the third passivation layer includes an oxide-based material, a nitride-based material or a combination thereof.

In accordance with some embodiments of the present disclosure, the third passivation layer is formed as a multi-layered structure.

In accordance with some embodiments of the present disclosure, the third passivation layer includes a first sub-layer and a second sub-layer disposed on the first sub-layer opposite to the capacitor structure, the first sub-layer including an oxide-based material and the second sub-layer including silicon nitride.

In accordance with some embodiments of the present disclosure, a semiconductor packaging structure includes a first passivation layer, a capacitor structure, and a second passivation layer. The capacitor structure is disposed on the first passivation layer. The second passivation layer is disposed on the capacitor structure opposite to the first passivation layer. The second passivation layer has a compressive stress smaller than −0.3 GPa.

In accordance with some embodiments of the present disclosure, the compressive stress of the second passivation layer is smaller than −0.3 GPa and is not smaller than −0.6 GPa.

In accordance with some embodiments of the present disclosure, the first passivation layer has a thickness ranging from 1000 Å to 4000 Å.

In accordance with some embodiments of the present disclosure, each of the first passivation layer and the second passivation layer includes an oxide-based material, a nitride-based material, a tetraethoxysilane (TEOS), or combinations thereof.

In accordance with some embodiments of the present disclosure, the second passivation layer has a thickness ranging from 5000 Å to 8000 Å.

In accordance with some embodiments of the present disclosure, a semiconductor packaging structure includes a first passivation layer, a capacitor structure, a second passivation layer, a redistribution unit, and a third passivation layer. The capacitor structure is disposed on the first passivation layer. The second passivation layer is disposed on the capacitor structure opposite to the first passivation layer. The redistribution unit is disposed on the second passivation layer and penetrates through the second passivation layer, the capacitor structure and the first passivation layer. The third passivation layer is disposed on the redistribution unit and the second passivation layer has a thickness ranging from 30000 Å to 60000 Å.

In accordance with some embodiments of the present disclosure, the second passivation layer includes an oxide-based material, a nitride-based material or a combination thereof.

In accordance with some embodiments of the present disclosure, the second passivation layer has a compressive stress smaller than −0.3 GPa.

In accordance with some embodiments of the present disclosure, the third passivation layer includes a first sub-layer and a second sub-layer disposed on the first sub-layer opposite to the capacitor structure. The first sub-layer includes an oxide-based material. The second sub-layer includes silicon nitride.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor packaging structure, comprising:
   forming a first passivation layer;
   forming a capacitor structure on the first passivation layer;
   forming a second passivation layer on the capacitor structure opposite to the first passivation layer, the second passivation layer being formed by chemical vapor deposition with parameters such that the compressive stress of the second passivation layer is smaller than-0.3 GPa; and
   forming a redistribution unit on the second passivation layer, the redistribution unit including:
   a main body penetrating the second passivation layer, the capacitor structure, and the first passivation layer, and
   an extending body extending upwardly from the main body, the extending body including an upper portion and a lower portion connected between the upper portion and the main body, the lower portion having a horizontal cross-section area larger than a horizontal cross-section area of the upper portion, wherein the upper portion includes a first part and a second part disposed between the first part and the lower portion, the first part having a curved top surface, the second part having a rectangular cross-sectional shape.

2. The method of claim 1, wherein the compressive stress of the second passivation layer is smaller than-0.3 GPa and is not smaller than-0.6 GPa.

3. The method of claim 1, wherein the parameters include a pressure ranging from 2.0 Torr to 5.0 Torr.

4. The method of claim 1, wherein the chemical vapor deposition is a plasma-based chemical vapor deposition.

5. The method of claim 4, wherein a plasma generation power used in the plasma-based chemical vapor deposition is greater than 900 W.

6. The method of claim 1, further comprising, after the step of forming the second passivation layer, forming a third passivation layer on the second passivation layer opposite to the capacitor structure, the third passivation layer having a thickness ranging from 30000 Å to 60000 Å.

7. The method of claim 1, further comprising forming an etch stop layer below the first passivation layer.

8. The method of claim 7, where the main body of the redistribution unit further penetrates the etch stop layer.

9. The method of claim 1, wherein each of the first passivation layer and the second passivation layer is formed as a single layer structure.

10. The method of claim 1, wherein the capacitor structure includes:
   a patterned first conductive plate disposed on the first passivation layer;
   a first dielectric layer disposed on the patterned first conductive plate and the first passivation layer;
   a patterned second conductive plate disposed on the first dielectric layer opposite to the patterned first conductive plate;
   a second dielectric layer disposed on the first dielectric layer and the patterned second conductive plate opposite to the first passivation layer;
   a patterned third conductive plate disposed on the second dielectric layer opposite to the first passivation layer;
   a third dielectric layer disposed on the second dielectric layer and the patterned third conductive plate opposite to the first passivation layer; and
   a patterned fourth conductive plate disposed on the third dielectric layer opposite to the first passivation layer.

11. The method of claim 10, wherein the second passivation layer is disposed on the patterned fourth conductive plate and an exposed portion of the third dielectric layer exposed from the patterned fourth conductive plate.

12. A method for manufacturing a semiconductor packaging structure, comprising:
   forming a capacitor structure on a substrate;
   forming a passivation layer on the capacitor structure opposite to the substrate, the passivation layer being formed by plasma-based chemical vapor deposition using a gas plasma and with parameters such that the compressive stress of the passivation layer is smaller than-0.3 GPa, the gas plasma including nitrous oxide (N$_2$O), the parameters including a pressure that ranges from 2.0 Torr to 5.0 Torr, and a temperature that ranges from 300° C. to 500° C.;
   forming a redistribution unit on the passivation layer, the redistribution unit penetrating the passivation layer and the capacitor structure;
   conformally forming another passivation layer on the redistribution unit and the passivation layer, the another passivation layer including a horizontal portion disposed on the passivation layer, and a curved portion extending upwardly from the horizontal portion and covering the redistribution unit; and
   forming an insulating layer on the another passivation layer opposite to the substrate, the insulating layer having a bottom surface which includes an indented surface portion that defines a receiving space, in which the curved portion of the another passivation layer is disposed.

13. The method of claim 12, wherein the passivation layer includes an oxide-based material, a nitride-based material, a tetraethoxysilane (TEOS), or combinations thereof.

14. The method of claim 13, wherein the passivation layer is formed using a precursor that includes silane.

15. The method of claim 14, wherein, during formation of the passivation layer, a flow rate of the precursor ranges from 250 sccm to 850 sccm.

16. The method of claim 12, wherein the passivation layer has a thickness ranging from 5000 Å to 8000 Å.

17. The method of claim 12, wherein the substrate includes a dielectric layer and a conductive feature disposed in the dielectric layer, and wherein the method further comprises, after formation of the passivation layer, forming a redistribution unit that includes a main body and an extending body, the main body penetrating the passivation layer and the capacitor structure, and being electrically connected to the conductive feature of the substrate, the extending body extending from the main body and including a lower portion that is disposed on the main body, and that contacts a part of an upper surface of the passivation layer.

18. A method for manufacturing a semiconductor packaging structure, comprising:
   forming a first passivation layer on a substrate that includes a dielectric layer and a conductive feature disposed on the dielectric layer;
   forming a capacitor structure on the first passivation layer opposite to the substrate;
   forming a second passivation layer on the capacitor structure opposite to the first passivation layer, the second passivation layer being formed by chemical vapor deposition with parameters such that the compressive stress of the second passivation layer is smaller than-0.3 GPa;
   forming a redistribution unit disposed on the second passivation layer, the redistribution unit including a main body that penetrates the second passivation layer, the capacitor structure and the first passivation layer to be electrically connected to the conductive feature of the substrate; and
   conformally forming a third passivation layer on the redistribution unit and the second passivation layer, the third passivation layer having a top surface distal from the second passivation layer, the top surface of the third passivation layer including a plurality of horizontal surface portions and a plurality of curved surface portions, each of the plurality of curved surface portions being connected between two adjacent ones of the plurality of horizontal surface portions.

19. The method of claim 18, wherein the third passivation layer includes a first sub-layer and a second sub-layer, wherein
   the first sub-layer includes a first horizontal portion disposed on the second passivation layer, and a first curved portion extending upwardly from the first horizontal portion and covering the redistribution unit; and the second sub-layer includes a second horizontal portion disposed on the first horizontal portion, and a second curved portion extending upwardly from the second horizontal portion and covering the first curved portion.

20. The method of claim 18, wherein the second passivation layer includes an undoped silicate glass, a tetraethoxysilane (TEOS), or a combination thereof.

\* \* \* \* \*